United States Patent
Lubicki et al.

(10) Patent No.: US 8,604,449 B2
(45) Date of Patent: Dec. 10, 2013

(54) GLITCH CONTROL DURING IMPLANTATION

(75) Inventors: Piotr R. Lubicki, Peabody, MA (US); Bon-Woong Koo, Andover, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 240 days.

(21) Appl. No.: 13/160,573

(22) Filed: Jun. 15, 2011

(65) Prior Publication Data

US 2012/0003760 A1     Jan. 5, 2012

Related U.S. Application Data

(60) Provisional application No. 61/360,736, filed on Jul. 1, 2010, provisional application No. 61/360,744, filed on Jul. 1, 2010.

(51) Int. Cl.
*G21G 5/00*     (2006.01)

(52) U.S. Cl.
USPC .............. 250/492.21; 250/492.3; 438/10

(58) Field of Classification Search
USPC ................. 438/514–518, 10; 250/423, 250/492.1–492.3
See application file for complete search history.

(56) References Cited

U.S. PATENT DOCUMENTS

| | | |
|---|---|---|
| 7,005,657 B1 | 2/2006 | Low et al. |
| 7,361,913 B2 | 4/2008 | Low et al. |
| 7,507,977 B2 | 3/2009 | Weiguo et al. |
| 2006/0087244 A1 | 4/2006 | Regan |
| 2008/0078955 A1 | 4/2008 | Graf et al. |
| 2010/0072393 A1 | 3/2010 | Regan |

FOREIGN PATENT DOCUMENTS

WO     2007111822 A2     10/2007

OTHER PUBLICATIONS

Scheuer, J.T., et al., VIISTa 810 Dosimetry Performance, Ion Implantation Technology, 2000: Proceedings/2000 International Conference on Ion Implantation Technology: Alpbach, Austria, Sep. 17, 2000, pp. 615-618, IEEE Operations Center, Piscataway, New Jersey, US.

*Primary Examiner* — Richard Booth

(57) ABSTRACT

An ion implantation system and method are disclosed in which glitches in voltage are minimized by modifications to the power system of the implanter. These power supply modifications include faster response time, output filtering, improved glitch detection and removal of voltage blanking. By minimizing glitches, it is possible to produce solar cells with acceptable dose uniformity without having to pause the scan each time a voltage glitch is detected. For example, by shortening the duration of a voltage to about 20-40 milliseconds, dose uniformity within about 3% can be maintained.

16 Claims, 6 Drawing Sheets

GLITCH CONTROL DURING IMPLANTATION

This application claims priority of U.S. Provisional Patent Application Ser. No. 61/360,736, filed Jul. 1, 2010 and U.S. Provisional Patent Application Ser. No. 61/360,744, filed Jul. 1, 2010, the disclosures of which are incorporated herein by reference in their entireties.

FIELD

This invention relates to ion implantation and, more particularly, to uniformity during ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

There are many different solar cell architectures. Two common designs are the selective emitter (SE) and the interdigitated backside contact (IBC). A SE solar cell has high-dose stripes across the lightly doped surface impinged by sunlight. An IBC solar cell has alternating p-type and n-type stripes across the surface not impinged by sunlight. Both a SE and IBC solar cell may be implanted with ions to dope the various regions.

"Glitches" may occur during the ion implantation process. A glitch is defined as a sudden degradation in the beam quality during an ion implantation operation, typically due to a variation in an operating voltage, which potentially renders the workpiece unusable. Such a glitch is typically caused by interactions between components along the beam path, which affect one or more operating voltages, and can be caused at various locations along the beam path. For example, ion implanters generally employ several electrodes along this beam path, which accelerate the beam, decelerate the beam, or suppress spurious streams of electrons that are generated during operation. Each of these electrodes is maintained at a predetermined voltage. Often, electrodes of different voltage are located near each other and therefore an arc may occur between electrodes. Generally, arcs occur across acceleration gaps, deceleration gaps, or suppression gaps, although arcs may occur elsewhere. Interaction between, for example, a source extraction voltage, source suppression voltage, and source beam current may cause a glitch. These glitches may be detected as a sharp change in the current from one of the power supplies. If the implantation is interrupted or affected by a glitch, the implanted solar cell or other workpiece may be negatively affected. For example, a solar cell may have a lower efficiency due to the lower implanted dose caused by a glitch. This may have a cost impact on the implanted workpieces. Thus, steps are usually taken to both minimize the occurrence of such glitches and to recover from the glitches if possible.

FIG. 1 is a chart illustrating a glitch. The beam current is set to a predetermined value 10. The glitch 11 occurs during the period marked $\Delta t$ outlined by the dotted lines 12, 13 where the beam current drops below the predetermined value 10. Minimizing the $\Delta t$ period means that there is less negative impact on the workpiece being implanted. The glitch 11 may be sensed by measuring changes in voltage or current. An arc is typically sensed by either an abrupt voltage collapse, or an abrupt current surge. When a glitch is detected, one solution is to immediately reduce the ion beam current to zero, thus terminating the implantation at a defined location on the workpiece. This is referred to as "blanking the beam". FIG. 2 is a chart illustrating blanking an ion beam. At time 100 when the glitch is first detected, the voltage is dropped to zero and then slowly built back up to the desired voltage level. At this time, implantation stops as well, and the position at this time is saved. In one instance, the voltage may be blanked for tens of milliseconds before voltage is recovered over the next hundred or more milliseconds. When the voltage recovers within 0.1-0.5% of the desired value, such as at time 101, implantation may continue from the location where it had stopped. Thus, once the glitch condition has been remedied, the implantation process ideally resumes at exactly the same location on the workpiece, with ideally the same beam characteristics as existed when the glitch was detected. The goal is to achieve a uniform doping profile, and this can be achieved by controlling the beam current or the workpiece scan speed (exposure time). However, blanking is time-consuming, which has a negative impact on throughput. Decreased throughput also results in higher costs.

Repairing the dose loss caused by the glitch in such a manner may take over 30 seconds, which may be too time-consuming for the throughput demands of the solar cell industry. Ion beam stability and implant uniformity within the ion implanter are controlled by the speed of the voltage and current sources connected to the ion implanter.

Therefore, there is a need in the art for an improved method of glitch recovery during the implantation of workpieces and, more particularly, solar cells.

SUMMARY

An ion implantation system and method are disclosed in which glitches in voltage are minimized by modifications to the power system of the implanter. These power supply modifications include faster response time, output filtering, improved glitch detection and removal of voltage blanking. By minimizing number of glitches and their duration, it is possible to produce solar cells with acceptable dose uniformity without having to pause the scan each time a voltage glitch is detected. For example, by shortening the duration of a voltage collapse to about 20-40 milliseconds, dose uniformity within about 3% can be maintained.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of this method are described herein in connection with an ion implanter. Beam-line ion implanters, plasma doping ion implanters, or flood ion implanters may be used. Any n-type and p-type dopants may be used, but the embodiments herein are not limited solely to dopants. Furthermore, embodiments of this process may be applied to many solar cell architectures or even other workpieces such as semiconductor wafers, flat panels, or light emitting diodes (LEDs). Thus, the invention is not limited to the specific embodiments described below.

Figure 3:
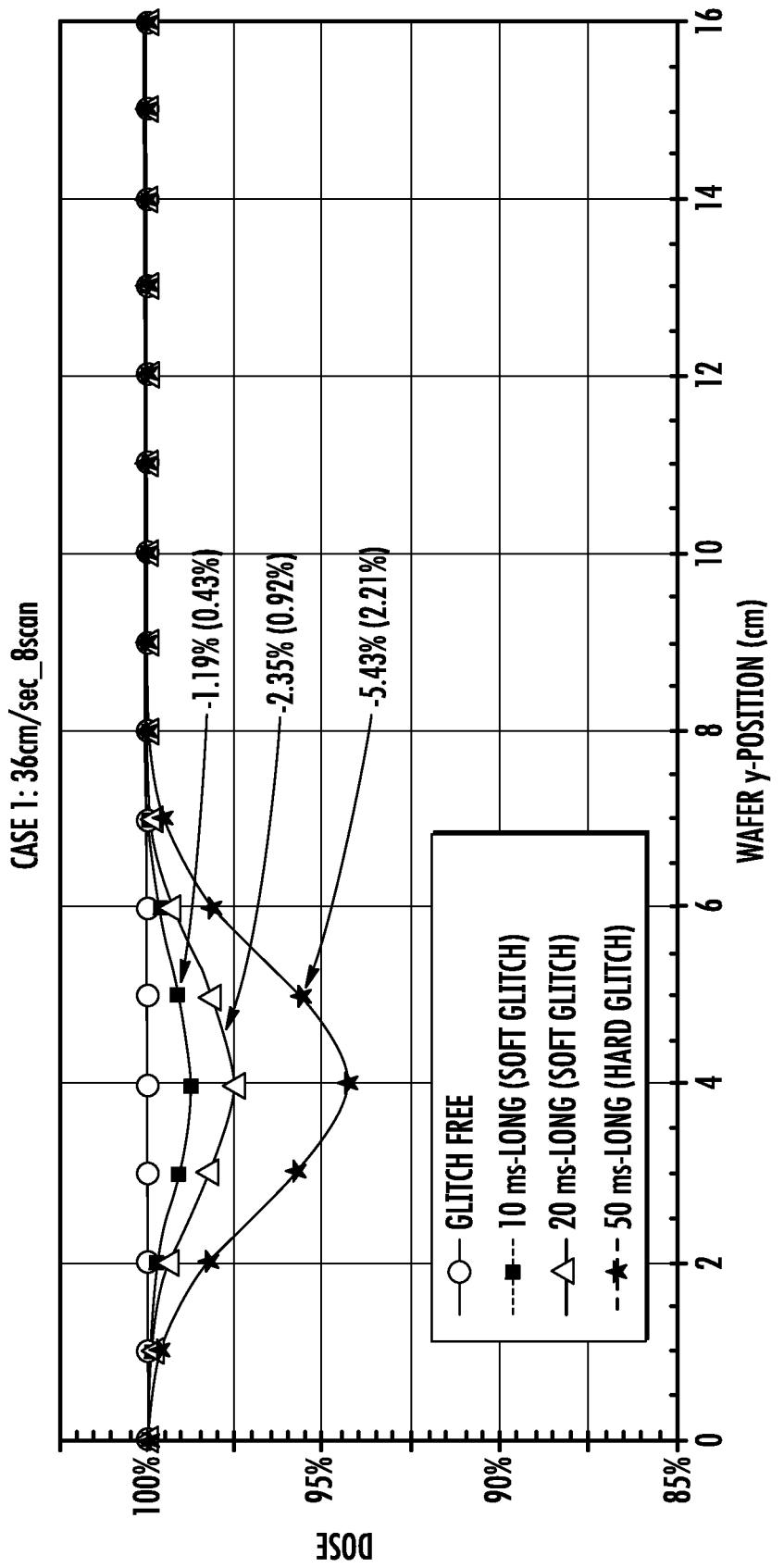
FIG. 3 is a chart comparing dose versus workpiece y-position for beam glitches of various duration.
Figure 4:
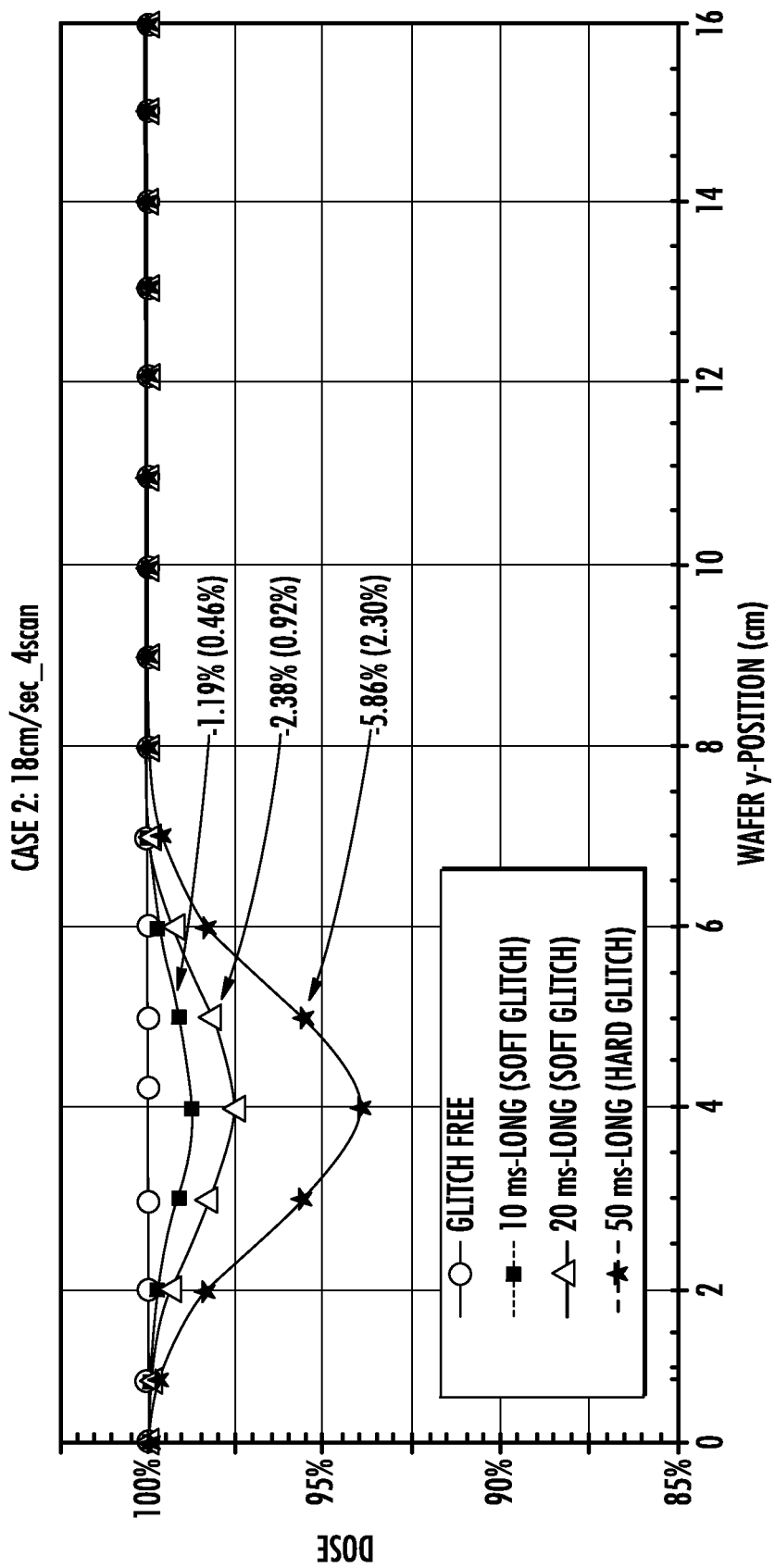
FIG. 4 is a second chart comparing dose versus workpiece y-position for beam glitches of various duration.

As noted above, glitches may cause non-uniformity of ion implantation. However, the extent of the non-uniformity is related to the duration of the glitch. FIGS. 3-4 are charts comparing dose versus workpiece y-position for glitches of various durations. FIG. 3 represents a 4 scan implant operating at 36 cm/sec scan rate. FIG. 4 represents a 4 scan implant at 18 cm/sec scan rate. In both charts, a uniform dose is desired. Glitches of various durations are modeled, where the glitch occurs as the ion beam was scanning across the wafer. A glitch of, for example, 50 ms may impact the dose of the workpiece by more than 5% in the region impacted by the glitch. In some embodiments, this degradation may be to an extent that, for example, a solar cell may have reduced efficiency. Smaller time periods may have negligible or acceptable effects on the workpiece. For example, a glitch of 10 ms may only reduce the dose in the affected region by about 1%. Similarly, a glitch of 20 ms may affect the impacted region by about 2-2.5%. Modeling indicates that glitch duration should be controlled within approximately 20-40 ms to maintain doping uniformity within approximately 2-3%. This level of uniformity may be sufficient for the production of solar cells. Thus, if glitches can be reduced to such durations, solar cell efficiency is not substantially impacted and throughput is not compromised.

Figure 5A:
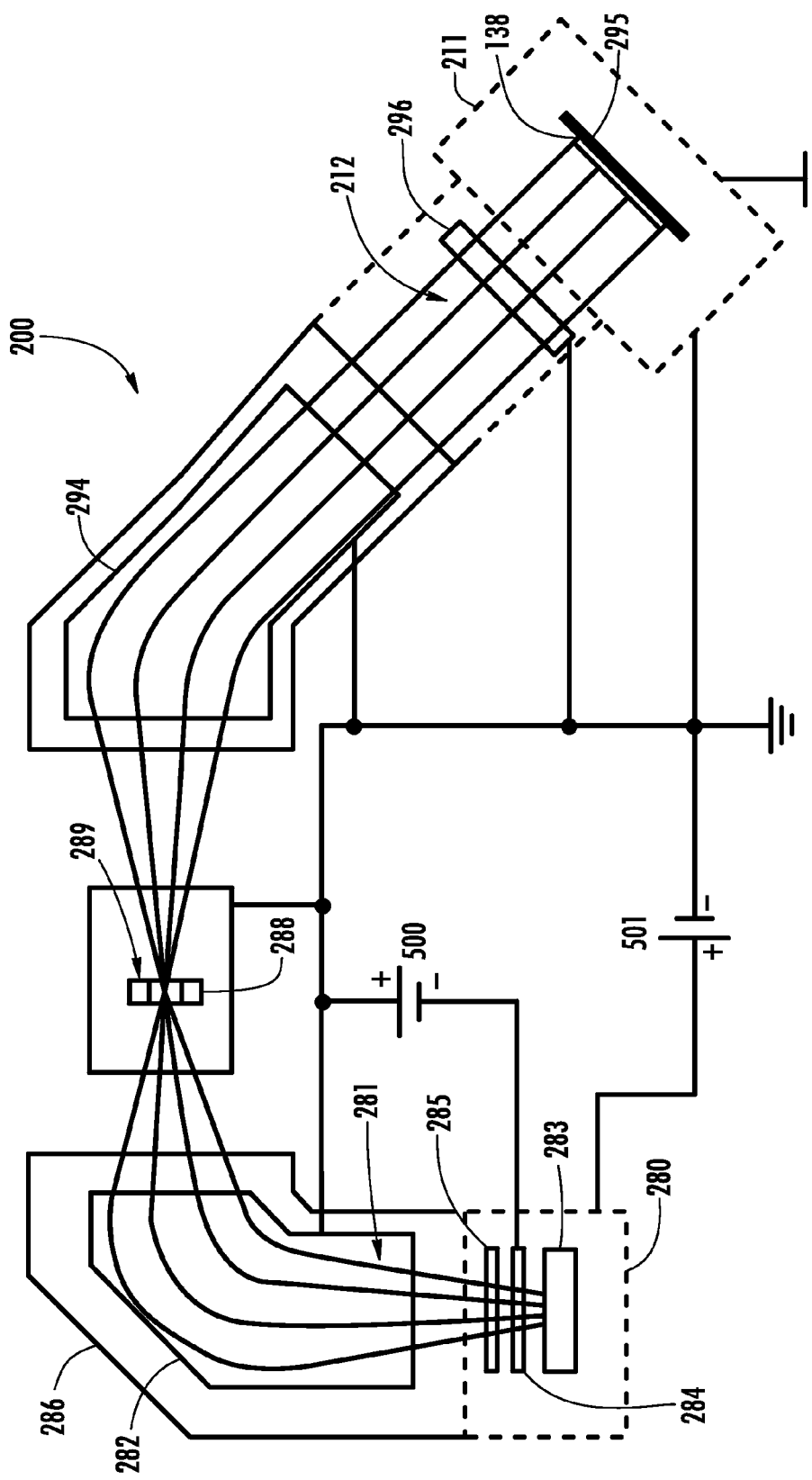
FIG. 5A is a block diagram of a beam-line ion implanter.

FIG. 5A is a first block diagram of a beam-line ion implanter 200. In one instance, this may be for doping a semiconductor wafer or solar cell. Those skilled in the art will recognize that the beam-line ion implanter 200 is only one of many examples of beam-line ion implanters that can produce ions. Thus, the embodiments disclosed herein are not limited solely to the beam-line ion implanter 200 of FIG. 5A.

In general, the beam-line ion implanter 200 includes an ion source 280 to generate ions that form an ion beam 281. The ion source 280 may include an ion chamber 283. A gas is supplied to the ion chamber 283 where the gas is ionized. This gas may be or may include or contain, in some embodiments, hydrogen, helium, other rare gases, oxygen, nitrogen, arsenic, boron, phosphorus, aluminum, indium, antimony, carborane, alkanes, another large molecular compound, or other p-type or n-type dopants. The ions thus generated are extracted from the ion chamber 283 to form the ion beam 281. The ion beam 281 passes through a suppression electrode 284 and ground electrode 285 to the mass analyzer 286. The mass analyzer 286 includes a resolving magnet 282 and a masking electrode 288 having a resolving aperture 289. The resolving magnet 282 deflects ions in the ion beam 281 such that ions of a desired ion species pass through the resolving aperture 289. Undesired ion species do not pass through the resolving aperture 289, but are blocked by the masking electrode 288.

Ions of the desired ion species pass through the resolving aperture 289 to the angle corrector magnet 294. The angle corrector magnet 294 deflects ions of the desired ion species and converts the ion beam from a diverging ion beam to ribbon ion beam 212, which has substantially parallel ion trajectories. The beam-line ion implanter 200 may further include acceleration or deceleration units in some embodiments. This particular embodiment has a deceleration unit 296.

An end station 211 supports one or more workpieces, such as workpiece 138, in the path of ribbon ion beam 212 such that ions of the desired species are implanted into workpiece 138. The workpiece 138 may be, for example, a solar cell. The end station 211 may include a platen 295 to support one or more workpieces 138. The end station 211 also may include a scanner (not shown) for moving the workpiece 138 perpendicular to the long dimension of the ribbon ion beam 212 cross-section, thereby distributing ions over the entire surface of workpiece 138. Although the ribbon ion beam 212 is illustrated, other embodiments may provide a spot beam. It will be understood to those skilled in the art that the entire path traversed by the ion beam is evacuated during ion implantation. The beam-line ion implanter 200 may include additional components known to those skilled in the art and may incorporate hot or cold implantation of ions in some embodiments.

The beam-line ion implanter 200 of FIG. 5A also includes two power supplies: a source suppression power supply 500 and an extraction power supply 501. In this embodiment, the suppression power supply 500 negatively biases the suppression electrode 284 relative to ground. In this embodiment, the resolving magnet 282, the unit surrounding the masking electrode 288, the angle corrector magnet 294, the deceleration unit 296 and the end station 211 are all connected to ground. The extraction power supply 501 is used to positively bias the ion source 280 relative to ground. There are three specific instances where the glitches may occur. First, the extraction electrode, which is positively biased, may arc to the suppression electrode 284, which is negatively biased. Second, the suppression electrode 284, which is negatively biased, may arc to a ground electrode 285. Lastly, a positively biased extraction electrode may arc to a ground electrode.

Figure 5B:
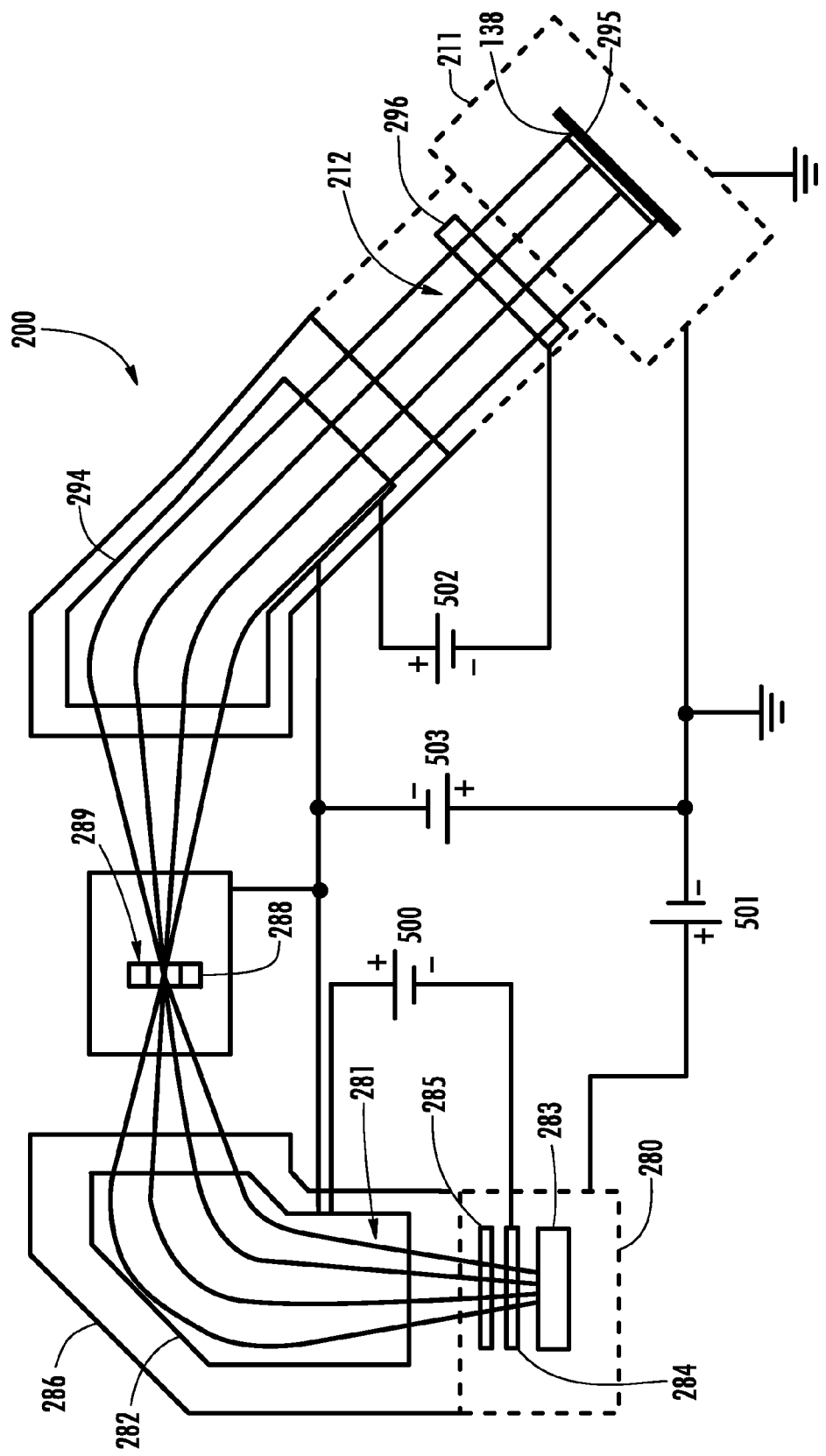
FIG. 5B is a second block diagram of a beam-line ion implanter.

A second block diagram of a beam-line ion implanter 400 is shown in FIG. 5B. This embodiment utilizes the same components described with respect to FIG. 5A, and therefore the description need not be repeated. However, by biasing the deceleration unit 296, the beam-line ion implanter 400 may operate in drift mode or process chamber deceleration (PCD) mode. The ion beam 281 and ribbon ion beam 212 are projected at a high speed until the deceleration unit 296 slows the ribbon ion beam 212 just prior to implantation into the workpiece 138. Drift or PCD mode allows the ion beam to maintain its desired characteristics with a minimum of, for example, beam "blow-up" due to space charge effects, while still implanting into the workpiece 138 at the desired energy.

To implement this, the beam-line ion implanter 400 also includes four power supplies. The suppression power supply 500 negatively biases the suppression electrode 284 relative to the resolving magnet 282, the unit surrounding the masking electrode 288 and the angle corrector magnet 294, which are all at the same voltage. In this embodiment, the end station 211 is connected to ground. The extraction power supply 501 is used to positively bias the ion source 280 relative to ground. A deceleration suppression power supply 502 is used to negatively bias the deceleration unit 296 relative to the angle corrector magnet 294. A deceleration power supply 503 is used to negatively bias the resolving magnet 282, the unit surrounding the masking electrode 288 and the angle corrector magnet 294 relative to ground. In this embodiment, there are six specific instances where glitches may occur. First, as described above, the extraction electrodes may arc to the suppression electrode 284. Second, the suppression electrode 284 may arc to a ground electrode 285. Third, an extraction electrode may arc to a ground electrode 285. Fourth, an electrode in the deceleration unit 296 may arc to the deceleration suppression. Fifth, the deceleration suppression may arc to ground. Lastly, the source extraction electrode may arc to ground.

The arcing corresponding to a glitch may be sensed by a voltage collapse to a value below the voltage threshold value or a current rise above the current threshold value. By improving arc detection of the voltage sources, it is possible to better control glitch duration. Faster arc detection and voltage recovery may be used to keep glitch durations below 20 ms. This allows, based on the data in FIGS. 3 and 4, a workpiece to be implanted to within 2-3% of the desired dose, which may be acceptable for workpieces such as solar cells.

As described above, glitches of sufficiently short duration may not impact the efficiency of a solar cell and will not reduce the manufacturing throughput. Thus, it is desirable to reduce glitches is about 20-40 ms. Most currently available high voltage power supplies have slow arc detection and very slow recovery. In fact, in some embodiments, a power supply may take hundreds of milliseconds to return to its nominal value after a glitch.

Regarding glitch detection, typically, a conventional power supply has a threshold of about 50%, meaning that it detects a fault when the voltage drops below 50% of the programmed value, or the current rises above 50% more than the adjusted value. Once this is detected, the power supply disables its output, a behavior also referred to as voltage blanking. After about 100 milliseconds, the voltage is ramped back to within 1-2% of the nominal value, and the power supply enables its output. In addition, most high voltage power supplies have slow control loop response, which is referred to as its time constant, due to the high output capacitance. For example, a high voltage power supply may have a 20 millisecond time constant. This lengthy time constant causes the output voltage to recover in about 100 milliseconds. This lengthy delay would cause an unacceptable drop of dose, rendering the solar cell unusable.

Therefore, to keep the glitch recovery to within approximately 2% of the desired voltage in less than 20 ms, the power system of the ion implanter 200, 400 must be modified.

First, the various power supplies are designed such that arc quenching or voltage blanking is eliminated. In other words, rather than disabling its output upon detection of a glitch, the redesigned power supplies attempt to overcome the glitch by increasing their current output, so as to attempt to maintain the nominal voltage. Thus, the redesigned power supplies exhibit the opposite behavior of conventional power supplies, which dramatically reduce their output current (typically to 0) upon detection of a glitch.

Secondly, the threshold voltage for detection of an arc is increased, as compared to conventional power supplies. In some embodiments, a glitch is detected when the voltage drops between 20-40% of its adjusted value, or its current increases between 20-40% of its adjusted value. By using a tighter threshold, the corrective action initiated by the redesigned power supplies may commence sooner, saving time and thereby minimizing the voltage glitch. As described above, once the redesigned power supply detects that the voltage or current outside its tightened threshold, it begins to increase its current output to overcome the fault.

Third, a resistance, such as 1 to 5 kΩ resistor is added in series with the output of each of the power supplies to filter arcs and limit the arc current. This resistance, in combination with the output capacitance of the power supplies serves as a filter that will help suppress arcs of short duration and absorb some energy from the arcs to minimize the damage caused.

Fourth, the power supplies are modified to have faster recovery after an arc, such as less than 50 milliseconds. As described above, power supplies have a control loop, having a time constant, which is used to establish and maintain the output voltage. Due to the excessive output capacitance of high voltage power supplies, these time constants are typically long, such as longer than 20 ms. A time constant of 20 millisecond results in the output voltage recovering in 100 milliseconds or more. In the present disclosure, the power supply is redesigned to have a time constant of less than 10 ms, thereby reducing the recovery time. In some embodiments, the output capacitance of the high voltage power supply may be reduced to help reduce the time constant.

In one embodiment, these features are all incorporated into the design of the power system of an ion implantation for use with solar cells. The extraction power supply 501 is redesigned to have faster recovery, such as a time constant of approximately 8 ms, and uses a tighter voltage threshold, such as 20-40%, for arc detection. In addition, voltage blanking is not used. An output resistance of 2 kΩ is used on the output of each power supply to further reduce the effects of arcs. In this embodiment, glitch recovery improves, as the ion beam may only be reduced for approximately 20-30 ms.

In another embodiment, the extraction power supply 501 recovers in less than 50 ms to within approximately 0.1% of the desired voltage, which may be considered a full recovery in one instance. Similar changes may be made to the other power supplies.

Figure 1:
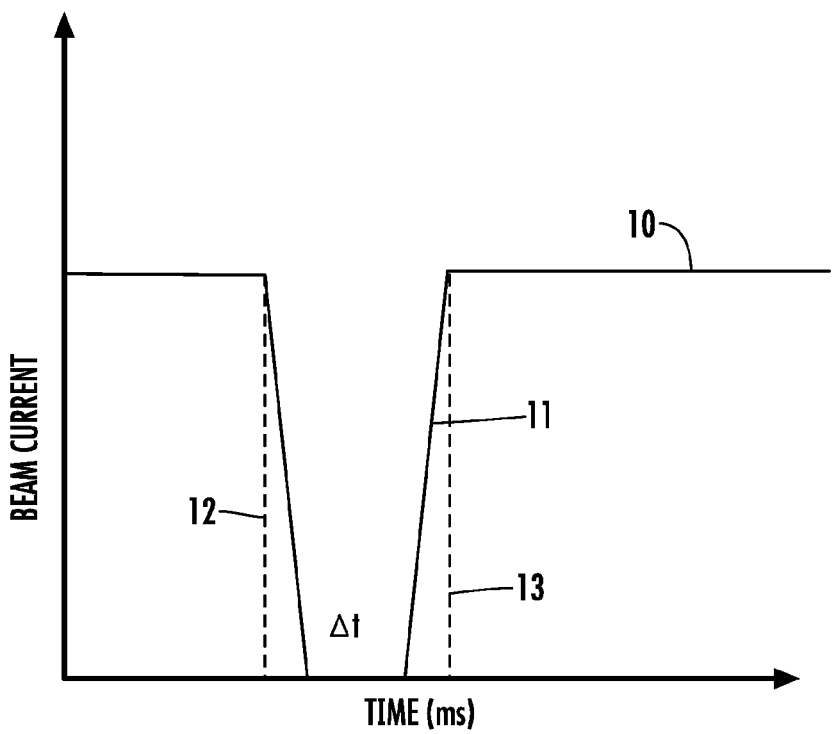
FIG. 1 is a chart illustrating a beam glitch.
Figure 2:
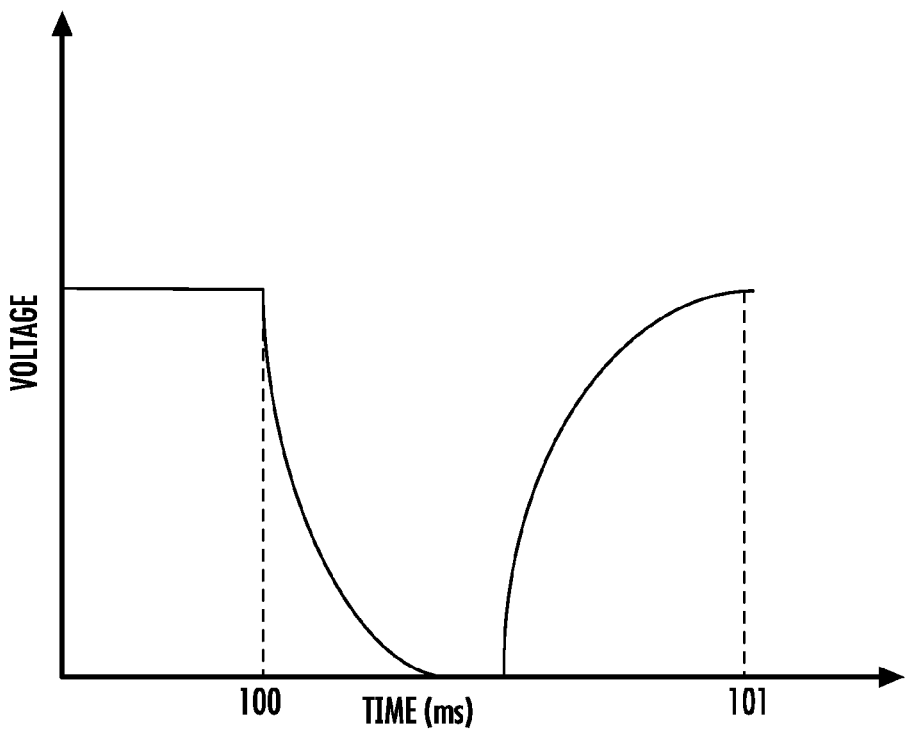
FIG. 2 is a chart illustrating blanking an ion beam.
Figure 6:
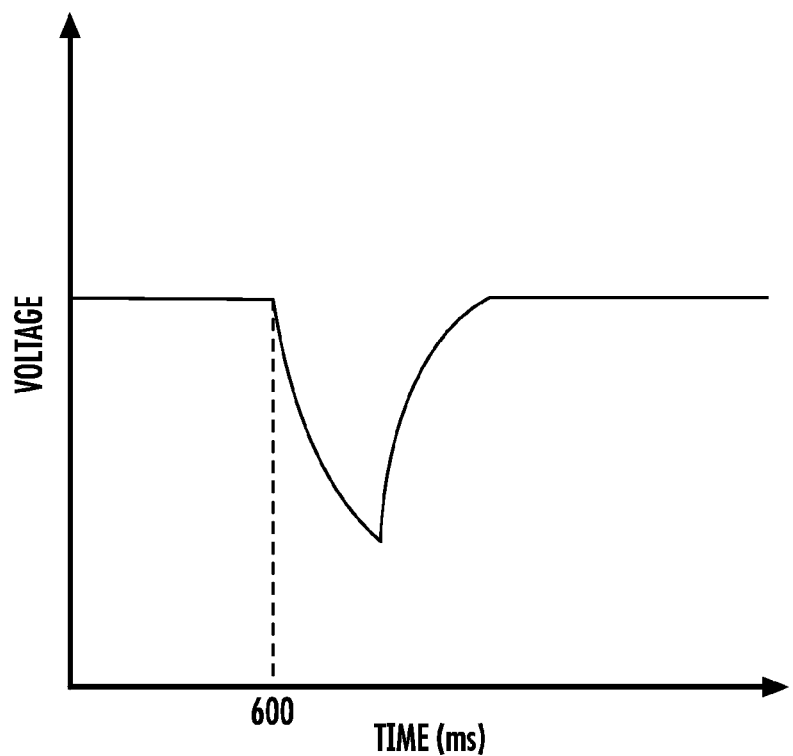
FIG. 6 is a chart illustrating an improved voltage recovery of beamline power supplies.
Figure 7:
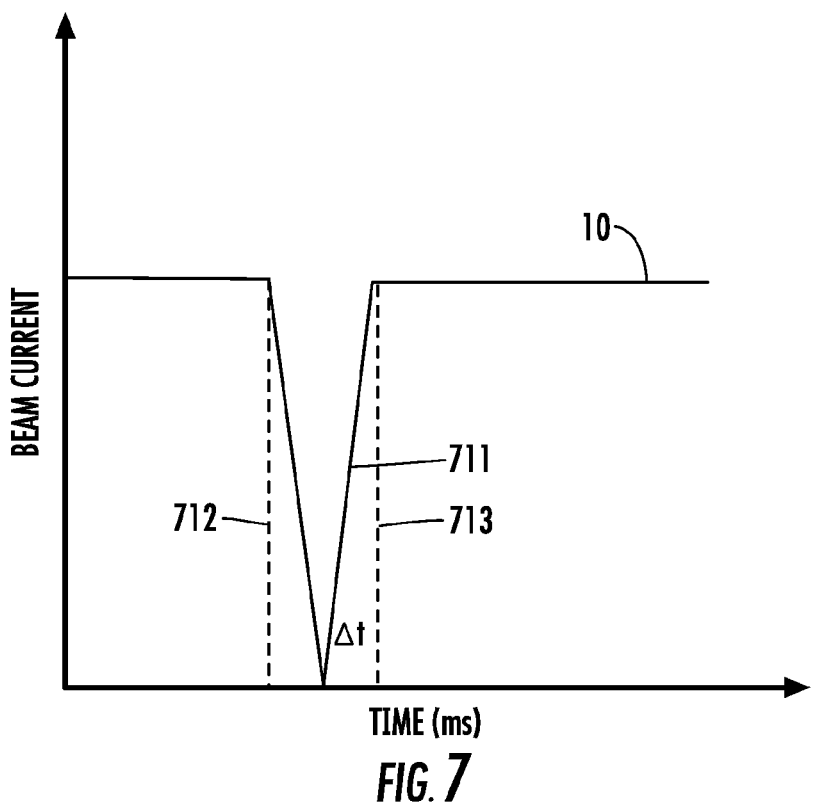
FIG. 7 is a chart illustrating an improved beam glitch recovery.

FIG. 6 is a chart illustrating an improved glitch recovery. At time 600 when the glitch is first detected, the voltage is dropped to a value above zero. Additionally, the voltage may recover back to the desired value faster than with the blanking illustrated in FIG. 2. A faster recovery means that the ion beam will not "disappear" or have a reduced dose for as long. This reduces non-uniformity of the implant dose. FIG. 7 shows a representative beam current based on the improved glitch control described herein. The duration of the beam current glitch 711, defined as the time between lines 712 and 713, is greatly reduced, compared to FIG. 1.

These changes allow a high throughput method of manufacturing semiconductors, where exact dose uniformity is not a requirement, such as solar cells. In such an embodiment, a substrate is placed on the platen 295. Ions are then directed toward the substrate by energizing the various components of the ion implantation system. The use of the modified power supplies serves to minimize the duration of any glitches, thus helping to maintain the dose uniformity to within about 3%. A controller (not shown) monitors the beam current being directed at the substrate. As long as the dips in the beam current are within a certain limit, such as 2-5%, preferably 3%, the dose uniformity is acceptable, and the ion implantation is allowed to continue. Dips greater than this will cause an unacceptable change in dose, rendering the substrate ineffective as a solar cell. In this case, the scanning of the substrate is stopped, while the beam current is restored to its nominal level. In other embodiments, rather or in addition to monitoring beam current, the voltage of each power supply is monitored for glitches. Glitches of a sufficiently short duration, such as less than 40 milliseconds, are allowed and scanning is continued. However, glitches of greater duration require the scanning to stop until the beam current is restored.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising
   an ion source;
   an electrode, maintained at a first voltage different than ground; and
   a power supply in communication with said electrode, wherein said power supply is configured to detect a glitch when said first voltage changes by more than a predetermined amount, and in response to said detection, said power supply increases a current output to attempt to restore said first voltage.

2. The ion implantation system of claim 1, wherein said predetermined amount is between 20% and 40% of said first voltage.

3. The ion implantation system of claim 1, wherein said power supply utilizes a control loop to establish and maintain said first voltage and wherein said control loop has a time constant of less than 10 milliseconds.

4. The ion implantation system of claim 1, further comprising a resistance located in series between said electrode and said power supply so as to create a filter.

5. The ion implantation system of claim 4, wherein said resistance is between 1 kilo-ohm and 5 kilo-ohms.

6. The ion implantation system of claim 1, further comprising at least one additional component, maintained at a second voltage, different than ground and said first voltage, and a second power supply in communication with said additional component wherein said second power supply is configured to detect a glitch when said second voltage changes by more than a predetermined amount, and in response to said detection, said second power supply increases a current output to attempt to restore said second voltage.

7. A method of manufacturing a solar cell from a substrate, comprising:
   directing a beam of ions having a beam current toward a substrate, wherein at least one power supply supplies a first voltage, different than ground, in order to direct said beam toward said substrate;
   scanning said beam relative to said substrate for as to implant a surface of said substrate;
   monitoring changes in said beam current of said beam;
   allowing said scanning to continue if said monitored beam current changes by less than a predetermined value, said value greater than zero, whereby said predetermined value guarantees a dose uniformity acceptable for a solar cell.

8. The method of claim 7, wherein said predetermined value is about 3%.

9. The method of claim 7, wherein said changes in said beam current are caused by changes in said first voltage, and further comprising configuring said power supply to minimize durations of said changes in said first voltage.

10. The method of claim 9, wherein said power supply reduces glitch duration to between 20 and 40 milliseconds.

11. The method of claim 9, comprising configuring said power supply to detect a glitch when said first voltage changes by more than a predetermined amount, and in response to said detection, to increase a current output to attempt to restore said first voltage.

12. The method of claim 11, wherein said predetermined amount is between 20% and 40% of said first voltage.

13. The method of claim 9, wherein said power supply utilizes a control loop to establish and maintain said first voltage and wherein said control loop has a time constant of less than 10 milliseconds.

14. The method of claim 7, further comprising a resistance located at an output of said power supply so as to create a filter.

15. The method of claim 14, wherein said resistance is between 1 kilo-ohm and 5 kilo-ohms.

16. The method of claim 7, further comprising stopping said scanning if said monitored changes in beam current are greater than said predetermined value.

* * * * *